United States Patent [19]

Buck et al.

[11] 4,424,458

[45] Jan. 3, 1984

[54] CONTACTLESS PROXIMITY SENSOR WITH MULTILEVEL RESPONSE

[76] Inventors: Robert Buck, Neukirch; Gerd Marhofer, Essen-Bredeney, both of Fed. Rep. of Germany

[21] Appl. No.: 309,480

[22] Filed: Oct. 7, 1981

[30] Foreign Application Priority Data

Oct. 9, 1980 [DE] Fed. Rep. of Germany ....... 3038102

[51] Int. Cl.³ .......................... A03K 3/26; G08B 3/00; H03K 5/153
[52] U.S. Cl. .................................. 307/361; 307/308; 307/311; 328/5; 340/691
[58] Field of Search ...................... 307/308, 311, 361; 328/5; 340/529, 555, 556, 691

[56] References Cited

U.S. PATENT DOCUMENTS

| | | | |
|---|---|---|---|
| 3,927,571 | 12/1975 | Athey | 340/691 |
| 4,079,323 | 3/1978 | Blanyer | 328/5 |
| 4,180,811 | 12/1979 | Yoshimura et al. | 340/566 |
| 4,311,994 | 1/1982 | Kuribayashi | 340/661 |

*Primary Examiner*—Stanley D. Miller
*Assistant Examiner*—B. P. Davis
*Attorney, Agent, or Firm*—Karl F. Ross; Herbert Dubno

[57] ABSTRACT

A signal detector of a contactless proximity sensor feeds three voltage comparators with reference inputs connected to points of different threshold potentials. When the incoming signal exceeds only the lowest threshold, a light-emitting diode is flashed at a low frequency; when the intermediate threshold is surpassed, the diode flashes at a higher frequency, whereas its light emission is continuous in the presence of a signal level above the highest threshold. Only in the last two instances will a load-control circuit be switched.

5 Claims, 2 Drawing Figures

CONTACTLESS PROXIMITY SENSOR WITH MULTILEVEL RESPONSE

FIELD OF THE INVENTION

Our present invention relates to a proximity sensor of the contactless type in which a receiver detects incoming signals indicative of the presence of an object in a predetermined area.

BACKGROUND OF THE INVENTION

Such proximity sensors may be of a purely electronic type, e.g. as disclosed in our U.S. Pat. No. 4,193,023 and earlier patents referred to therein, but could also be part of an opto-electronic monitoring system in which a beam of light emitted by a suitable source is intercepted by a photoelectric receiver in the presence or in the absence of the object whose location is to be ascertained. In the first instance the light beam is reflected back to the receiver by the object; in the second instance, where the light source and the receiver form a so-called light gate, the receiver is normally illuminated—directly or via a stationary reflector—by the emitted beam whose path is interrupted by the intruding object. In all these cases the output of any such proximity sensor is fed to a control circuit which either energizes or de-energizes a load when the object comes within a predetermined distance from the observation point or occupies a certain position relative thereto; the load could be a simple indicator (visual or aural, for example) and/or a switch starting or stopping an associated mechanism.

Since the load controlled by the proximity sensor is generally to be placed in one of two possible states, the sensor itself ought to assume either an "ON" or an "OFF" condition. In some situations, however, there is no clear-cut boundary line between these conditions as the detected signal (e.g. the detuning of an oscillator by an approaching metallic element or the illumination of a photoelectric device) may hover close to the load-triggering threshold for an extended period. In that condition the system is rather unstable and highly susceptible to spurious switching by external factors such as minor changes in ambient temperature, for example.

OBJECT OF THE INVENTION

The object of our present invention, therefore, is to provide means in such a monitoring system for apprising an operator of the existing instability so that corrective measures, e.g. a change in threshold level, may be taken.

SUMMARY OF THE INVENTION

We realize this object, in accordance with our present invention, by connecting the signal detector to a threshold circuit having a first, a second and a third output which are respectively energized in the presence of an incoming signal surpassing a low, an intermediate and a high level. A load-control circuit connected to the second output of the threshold circuit performs a switching operation in response to an incoming signal exceeding at least the intermediate level. The three outputs are further connected to a discriminating circuit which generates distinct indications of incoming signals respectively lying in a lower range between the low and intermediate levels and in an upper range between the intermediate and high levels. The terms "low", "intermediate" and "high " are, of course, to be understood in a relative sense.

Pursuant to a more particular feature of our invention, the discriminating circuit advantageously includes a visual indicator provided with pulse-generating means for emitting a flashing light whenever the incoming signal lies between the low and high levels referred to. When the signal amplitude is within the aforementioned lower range, the indicator flashes at a relatively low rate; with the signal in the upper range, the flashing rate is relatively high. The indicator preferably is lit continuously, denoting steady-state operation, when the signal amplitude exceeds the high level of the threshold circuit.

BRIEF DESCRIPITON OF THE DRAWING

The above and other features of our invention will now be described in detail with reference to the accompanying drawing in which.

SPECIFIC DESCRIPTION

Figure 1:
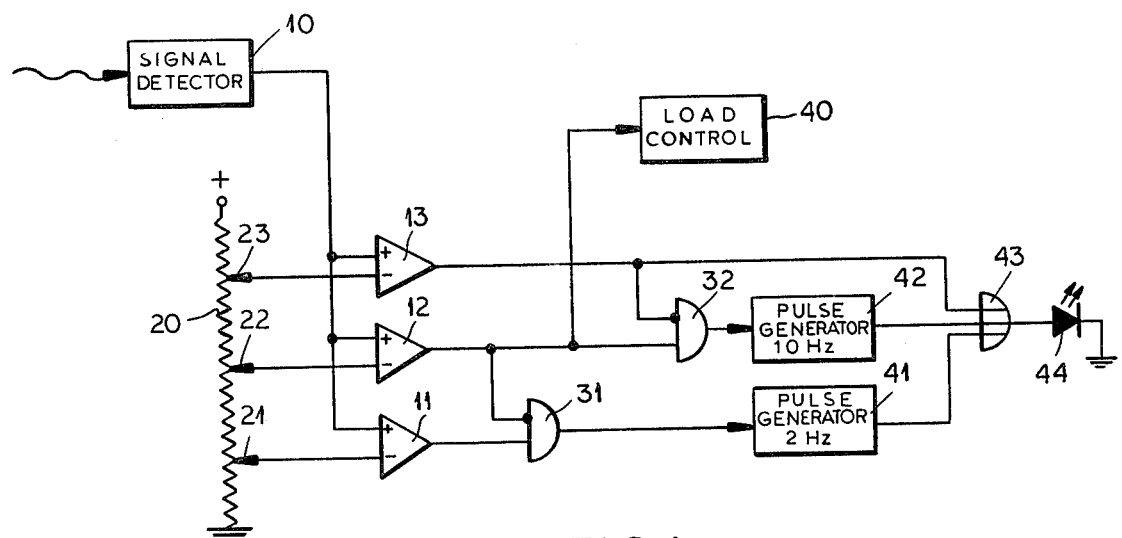
FIG. 1 is a circuit diagram of a proximity sensor embodying our invention.

In FIG. 1 we have shown a signal detector 10 which in an opto-electronic system may comprise a photoelectric device illuminated by an incoming beam. An output lead of detector 10 terminates at noninverting inputs of three voltage comparators 11, 12 and 13 having inverting inputs connected to respective taps 21, 22, 23 of a voltage divider 20. Comparator 11, connected to the tap 21 of lowest reference potential, has its output connected to a noninverting input of an AND gate 31 which has an inverting input tied to the output of comparator 12. The latter comparator, supplied with intermediate reference potential by potentiometer tap 22, also feeds a noninverting input of an AND gate 32 which has an inverting input connected to the output of comparator 13 receiving the highest reference potential from tap 23. A load-control circuit 40 is switchable from a normal state to an off-normal state, in the presence of an output signal of detector 10 exceeding the potential of tap 22, by an input connection from the output of comparator 12.

AND gates 31 and 32 work into respective pulse generators 41 and 42 which, as shown, are independent of contact circuit 40 and, on being activated, emit two different pulse trains to associated inputs of an OR gate 43 which has a further input tied to the output of comparator 13. OR gate 43, when conducting, energizes a light-emitting diode (LED) 44.

The pulse cadences of generators 41 and 42 lie well within the range of visual perception and may respectively be on the order of 2 Hz and 10 Hz, for example. The light beam illuminating the signal detector 10 in the case of an opto-electronic system may be modulated at a considerably higher pulse rate, e.g. of several hundred Hz, well above the limit of visual perception.

Figure 2:
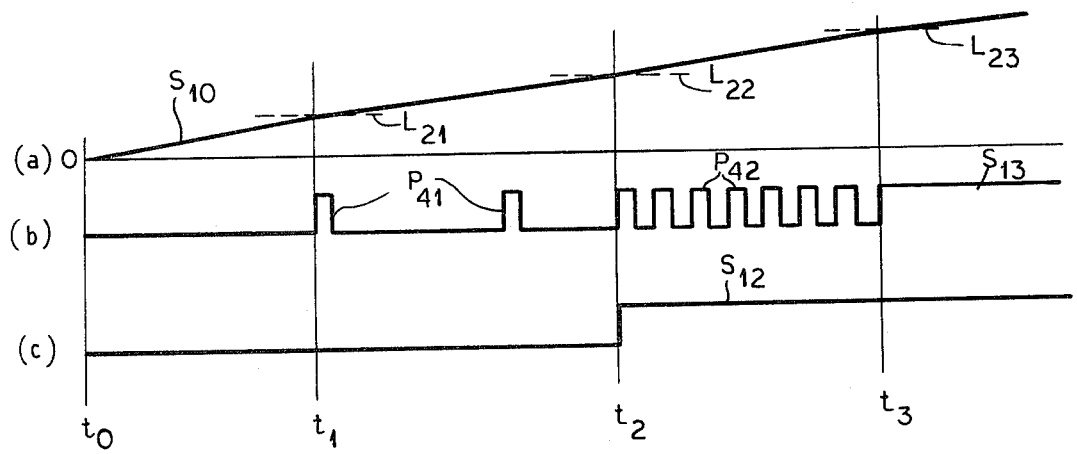
FIG. 2 is a set of graphs relating to the operation of the proximity sensor shown in FIG. 1.

The operation of the system of FIG. 1 will now be described with reference to FIG. 2 where graph (a) shows an output signal $S_{10}$ of detector 10 rising from zero at a time $t_0$ past the potential levels of taps 21, 22 and 23, designated $L_{21}$, $L_{22}$ and $L_{23}$, at times $t_1$, $t_2$ and $t_3$, respectively. Graph (b) shows the energization of LED 44 by pulses $P_{41}$, $P_{42}$ from generators 41, 42 and by a steady signal $S_{13}$ from comparator 13. Graph (c) represents a signal $S_{12}$ serving to switch the load-control circuit 40. In the interval between instants $t_0$ and $t_1$, none of the three comparators 11-13 has an output so that gates 31, 32 and 43 are cut off, LED 44 is dark and control circuit 40 is in its normal state. Between instants $t_1$ and $t_2$, comparator 11 alone has an output which renders the AND gate 31 conductive and activates generator 41 whereby LED 44 is flashed at a rate of two pulses $P_{41}$ per second. In the interval between instants $t_2$ and $t_3$, the output signal of comparator 12 cuts off the gate 31 and activates generator 42 by way of gate 32 whereby LED 44 is flashed at an increased rate of ten pulses $P_{42}$ per second. When signal $S_{10}$ surpasses the potential $L_{23}$ at instant $t_3$, the output of comparator 13 reblocks the gate 32 and continuously energizes LED 44 which therefore emits a steady glow from then on. As shown in graph (c) of FIG. 2, singal $S_{12}$ goes high at instant $t_2$ to switch the load-control circuit 40 into its alternate state.

The operator, on observing the flashing of the light-emitting diode, may stabilize the system by modifying either the output voltage of signal detector 10, as by changing the gain of a nonillustrated amplifier in that detector, or the appropriate reference potential through adjustment of a corresponding potentiometer tap. With a low-rate flash, for example, tap 22 may be shifted upward to prevent an untimely switchover; with a high-rate flash, on the other hand, the same tap could be shifted downward to stabilize the off-normal position of circuit 40.

Reference may be made to our copending application Ser. No. 309,481 of even date which discloses a monitoring system protected against interference from spurious signals by the use of pulsed outgoing and incoming signals which may be distinctly coded, the signal detector working into a blocking circuit which passes only those incoming signals that conform to a certain code configuration and/or consist of a certain minimum number of consecutive pulses. Such a blocking circuit could also be inserted between the signal detector 10 and the comparators 11-13 of FIG. 1 if the incoming signals are generated by a suitably pulsed transmitter.

Load-control circuit 40 may be of a type described in any of the patents referred to above, including an electronic switch such as a transistor, a thyristor or a triac.

We claim:

1. A contactless proximity sensor comprising:
a detector of incoming signals indicative of the presence of an object in a predetermined area;
a threshold circuit connected to said detector and provided with a first, a second and a third output respectively energized in the presence of an incoming signal surpassing a low, an intermediate and a high level;
a visual indicator;
load-control means connected to said second output for performing a switching operation in response to an incoming signal exceeding at least said intermediate level; and
pulse-generating means connected independently of said indicator to said first, second and third outputs for flashing said indicator at a relatively low rate in response to incoming signals lying in a lower range between said low and intermediate levels and flashing said indicator at a relatively high rate in response to incoming signals lying in an upper range between said intermediate and high levels, said rates lying within the range of visual perception.

2. A proximity sensor as defined in claim 1 wherein said third output is connected to said indicator for generating a continuous light emission in response to incoming signals surpassing said high level.

3. A proximity sensor as defined in claim 1 or 2 wherein said low rate is on the order of 2 Hz and said high rate is on the order of 10 Hz.

4. A proximity sensor as defined in claim 1 or 2 wherein said indicator is a light-emitting diode.

5. A proximity sensor as defined in claim 3 wherein said indicator is a light-emitting diode.

* * * * *